US010876986B2

(12) United States Patent
Corrigan, III et al.

(10) Patent No.: US 10,876,986 B2
(45) Date of Patent: Dec. 29, 2020

(54) INSULATED SENSORS

(71) Applicant: Hewlett-Packard Development Company, L.P., Spring, TX (US)

(72) Inventors: George H. Corrigan, III, Corvallis, OR (US); Chantelle Domingue, Corvallis, OR (US); Sadiq Bengali, Corvallis, OR (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 72 days.

(21) Appl. No.: 16/319,026

(22) PCT Filed: Oct. 5, 2016

(86) PCT No.: PCT/US2016/055449
§ 371 (c)(1),
(2) Date: Jan. 18, 2019

(87) PCT Pub. No.: WO2018/067136
PCT Pub. Date: Apr. 12, 2018

(65) Prior Publication Data
US 2019/0285564 A1    Sep. 19, 2019

(51) Int. Cl.
*G01N 27/12* (2006.01)
*B81B 7/00* (2006.01)
(Continued)

(52) U.S. Cl.
CPC ......... *G01N 27/128* (2013.01); *B81B 7/0025* (2013.01); *G01N 27/26* (2013.01);
(Continued)

(58) Field of Classification Search
CPC .................. G01N 27/128; G01N 27/26; B81B 2201/0214; B81B 7/0025; B81B 2203/04; H01L 21/82; H01L 27/04
(Continued)

(56) References Cited

U.S. PATENT DOCUMENTS 264,564  A  *  9/1882  Reckendorfer ........ B43K 27/08
                                                          401/34
4,621,277  A  *  11/1986  Ito ....................... H01L 21/3144
                                                          257/313
(Continued)

FOREIGN PATENT DOCUMENTS

CN         1563970         1/2005
EP         0264564  A1  *  4/1988   ............. G01K 7/223
(Continued)

OTHER PUBLICATIONS

Lambacher et al., Electrical imaging of neuronal activity by multi-transistor-array (MTA) recording at 7.8 um resolution, Appl. Phys. A 79, 1607-1611, pp. 1607-1611, 2004.
(Continued)

*Primary Examiner* — Patrick Assouad
*Assistant Examiner* — Sean Curtis
(74) *Attorney, Agent, or Firm* — Thorpe North & Western LLP

(57) ABSTRACT

The present disclosure is drawn to an insulated sensor including a silicon substrate with active circuitry on a surface thereof, an electrode disposed on the silicon substrate, a passivation layer having a thickness from greater than 500 Angstroms to 3,000 Angstroms disposed on the active circuitry, and an electrode insulating layer having a thickness from 10 Angstroms to 500 Angstroms disposed on the electrode.

20 Claims, 4 Drawing Sheets

US 10,876,986 B2
Page 2

(51) Int. Cl.
*G01N 27/26* (2006.01)
*H01L 27/04* (2006.01)
*H01L 21/82* (2006.01)

(52) U.S. Cl.
CPC ... *B81B 2201/0214* (2013.01); *B81B 2203/04* (2013.01); *H01L 21/82* (2013.01); *H01L 27/04* (2013.01)

(58) Field of Classification Search
USPC ............................................... 324/693, 722
See application file for complete search history.

(56) References Cited

U.S. PATENT DOCUMENTS

| | | | | |
|---|---|---|---|---|
| 4,977,658 A * | | 12/1990 | Awano | G01N 27/121 29/25.01 |
| 4,980,307 A * | | 12/1990 | Ito | H01L 21/3144 438/591 |
| 5,100,820 A * | | 3/1992 | Tsubone | H01L 21/28114 257/344 |
| 5,250,170 A * | | 10/1993 | Yagawara | G01N 27/12 204/431 |
| 5,306,946 A * | | 4/1994 | Yamamoto | H01L 21/3185 257/640 |
| 5,763,905 A * | | 6/1998 | Harris | H01L 21/045 257/636 |
| 5,972,725 A * | | 10/1999 | Wollesen | G01R 31/307 257/48 |
| 6,022,756 A * | | 2/2000 | Sparks | G01L 9/0055 438/53 |
| 6,191,476 B1 * | | 2/2001 | Takahashi | G02F 1/13454 257/706 |
| 6,478,976 B1 * | | 11/2002 | Lepert | G06K 9/00053 216/13 |
| 6,573,734 B2 * | | 6/2003 | He | G01N 27/07 324/696 |
| 6,657,269 B2 | | 12/2003 | Migliorato et al. | |
| 6,701,782 B2 * | | 3/2004 | Iwaki | G01F 1/692 73/204.26 |
| 6,759,302 B1 * | | 7/2004 | Chen | H01L 21/28202 438/275 |
| 7,089,790 B2 * | | 8/2006 | Silverbrook | B60C 23/0408 73/146 |
| 7,089,798 B2 * | | 8/2006 | Silverbrook | B60C 23/0408 73/715 |
| 7,118,974 B2 * | | 10/2006 | Chen | H01L 21/28202 438/287 |
| 7,138,317 B2 * | | 11/2006 | Chen | H01L 21/28202 438/275 |
| 7,549,342 B2 * | | 6/2009 | Silverbrook | B60C 23/0408 73/715 |
| 7,608,510 B2 * | | 10/2009 | Moens | H01L 29/407 438/268 |
| 7,872,728 B1 * | | 1/2011 | Yasukawa | G02F 1/13454 349/113 |
| 7,875,917 B2 * | | 1/2011 | Kim | H01L 27/14636 257/290 |
| 7,948,015 B2 * | | 5/2011 | Rothberg | H01L 27/088 257/253 |
| 7,989,886 B2 * | | 8/2011 | Moens | H01L 29/7809 257/330 |
| 8,107,049 B2 * | | 1/2012 | Yasukawa | G02F 1/1362 349/158 |
| 8,115,240 B2 * | | 2/2012 | Dam | G06F 3/0414 257/254 |
| 8,183,651 B2 * | | 5/2012 | Takagi | G01P 15/18 257/415 |
| 8,358,396 B2 * | | 1/2013 | Yasukawa | G02F 1/1368 349/158 |
| 8,525,968 B2 * | | 9/2013 | Yasukawa | G02F 1/13454 349/158 |
| 8,888,969 B2 * | | 11/2014 | Soleymani | G01N 27/3272 204/289 |
| 9,068,913 B2 * | | 6/2015 | Wienand | G01N 15/0656 |
| 9,153,495 B2 * | | 10/2015 | Aoki | H01L 21/76251 |
| 9,166,181 B2 * | | 10/2015 | Afzali-Ardakani | H01L 51/0021 |
| 9,240,561 B2 * | | 1/2016 | Majima | H01L 27/0688 |
| 9,379,155 B2 * | | 6/2016 | Nabe | H01L 27/14618 |
| 9,620,726 B2 * | | 4/2017 | Afzali-Ardakani | H01L 27/286 |
| 9,791,402 B2 * | | 10/2017 | Soleymani | G01N 27/3278 |
| 9,875,974 B2 * | | 1/2018 | Rogers | H01L 21/768 |
| 10,128,452 B2 * | | 11/2018 | Afzali-Ardakani | H01L 27/1222 |
| 10,274,453 B2 * | | 4/2019 | Soleymani | G01N 33/5438 |
| 10,549,316 B2 * | | 2/2020 | Budzelaar | A61B 8/488 |
| 2002/0090738 A1 * | | 7/2002 | Cozzette | B01L 3/502707 436/518 |
| 2003/0029245 A1 * | | 2/2003 | Izadnegahdar | G01L 9/0055 73/753 |
| 2008/0080111 A1 | | 4/2008 | Lin et al. | |
| 2009/0261387 A1 * | | 10/2009 | Adam | B81C 1/00246 257/254 |
| 2009/0273356 A1 * | | 11/2009 | Pampin | C12Q 1/6825 324/693 |
| 2010/0112546 A1 | | 5/2010 | Lieber et al. | |
| 2010/0147685 A1 * | | 6/2010 | Ikawa | G01N 27/128 204/431 |
| 2010/0288047 A1 * | | 11/2010 | Takagi | B81C 1/00246 73/514.32 |
| 2013/0341734 A1 * | | 12/2013 | Merz | G01N 27/4148 257/414 |
| 2014/0024073 A1 | | 1/2014 | Zhdaneev et al. | |
| 2015/0014624 A1 * | | 1/2015 | Majima | B82Y 10/00 257/9 |
| 2015/0187651 A1 * | | 7/2015 | Aoki | H01L 24/27 438/113 |
| 2015/0236282 A1 * | | 8/2015 | Afzali-Ardakani | H01L 27/326 257/40 |
| 2016/0005700 A1 * | | 1/2016 | Rogers | H01L 23/53257 438/107 |
| 2016/0035989 A1 * | | 2/2016 | Afzali-Ardakani | H01L 27/3244 257/40 |
| 2016/0123973 A1 * | | 5/2016 | Cubukcu | G01N 21/554 506/9 |
| 2017/0219518 A1 * | | 8/2017 | Lee | G01N 33/5438 |
| 2017/0234861 A1 * | | 8/2017 | Chen | G01N 33/54346 435/6.11 |
| 2017/0320091 A1 * | | 11/2017 | Budzelaar | A61B 8/4483 |
| 2018/0204917 A1 * | | 7/2018 | Lin | G01V 1/247 |
| 2019/0079047 A1 * | | 3/2019 | Rothberg | G01N 27/4148 |
| 2019/0094175 A1 * | | 3/2019 | Merriman | C12Q 1/6825 |
| 2019/0285564 A1 * | | 9/2019 | Corrigan, III | G01N 27/128 |
| 2020/0178801 A1 * | | 6/2020 | Nazari | A61B 5/0031 |

FOREIGN PATENT DOCUMENTS

EP 0264564 B1 * 11/1992 ............ G01K 7/223
WO WO-2018067136 A1 * 4/2018

OTHER PUBLICATIONS

Schmitt et al., Passivation and corrosion of microelectrode arrays, Electrochimica Acta 44, pp. 3865-3883, 1999.
Wang et al., A CMOS Capacitive Dopamine Sensor with Sub-nM Detection Resolution, IEEE Sensors 2009 Conference, pp. 400-404.
Tsai et al., High-channel-count, high-density microelectrode array for closed-loop investigation of neuronal networks, IEEE, 978-1-4244-9270, pp. 7510-7513, 2015.
Guo et al., PDMS-film coated on PCB for AC impedance sensing of biological cells, PubMed—NCBI, 2014, 2 pages, http://www.ncbi.nlm.nih.gov/pubmed/24850232.
Colomer-Farrarons et al., Portable Bio-Devices: Design of Electrochemical Instruments from Miniaturized to Implantable Devices,

(56) References Cited

OTHER PUBLICATIONS

New Perspectives in Biosensors Technology and Applications, 2011; pp. 373-400, www.intechopen.com.
Two layer electronic design and fully assembled chemical microprocessor, Scientific Figure on ResearchGate, 2016, 7 pages, https://www.researchgate.net/figure/221810185_fig4_Fig-4-Two-layer-electronic-design-and-fully-assembled-chemical-microprocessor-Top.
Emaminejad et al., Microfluidic Diagnostic Tool for the Developing World: Contactless Impedance Flow Cytometry, NIH Public Access Author Manuscript, Lab Chip., 2012, 4499-4507, doi:10.1039/c2lc40759k.
International Search Report dated Oct. 21, 2016 for PCT/US2016/058235, Applicant Hewlett-Packard Development Company, L.P.

* cited by examiner

INSULATED SENSORS

BACKGROUND

Sensors are used in a wide variety of technologies and can be used to measure motion, sound, light, temperature, humidity, air flow, ambient gases, and other environmental conditions. One growing area of sensor technology relates to microfluidic sensors. As these type of sensors are typically small in size and often in contact with various fluid, there can be limitations related to the reliability, longevity, and sensitivity of such sensors.

Figure 1:
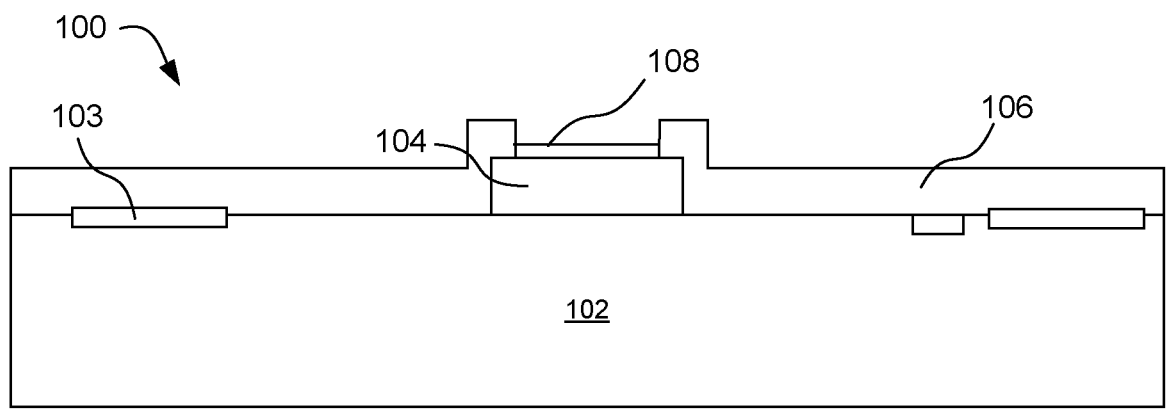
FIG. 1 schematically displays an example insulated sensor in accordance with the present disclosure.

The figures depict examples of the presently disclosed technology. However, it is understood that the present technology is not limited to the examples depicted.

DETAILED DESCRIPTION

Fully integrated bio-sensing devices can combine microfluidics, internal pumping mechanisms, and active electronic circuits. Typically, microfluidic sensors include an uncoated sensor surface where an electrode thereon is in direct contact with the solution being measured. These sensors can perform well when the sensing system provides additional electrodes to compensate for the electrochemical effects of applying potential to an electrode in contact with a fluid, or the applied potentials are well below the activation energies of the electrochemical cell thus preventing electrolysis. In the case of a silicon substrate where active circuits and microfluidic channels are integrated along with the sensing electrodes, the voltage potentials applied to the electrodes become further constrained because of the difficulty and cost of isolating the sensing fluid from the silicon surface. Fluid in contact with silicon can become biased at the potential of the silicon making it impossible to apply an electrode potential below the potential of the fluid and precluding the use of zero-offset AC (bipolar) biasing. This may also limit the extent of using DC bias. Applying a DC bias of greater than a few millivolts to these sensors can lead to electrolysis and can compromise the sensing function of the electrodes. Thus, incorporating active circuits on a silicon substrate that is in direct contact with the sensing fluid can severely limit the operating voltage range of the sensor.

As can be seen, building a true AC sensor can be difficult, and a DC sensor built conventionally has limitations. In accordance with the present disclosure, building a microfluidic sensor having active circuitry on a sensor surface that also insulates the electrodes from the solution being measured would provide several advantages. However, applying a conventional insulating layer to the electrodes can significantly reduce the sensitivity of the sensor. In one example, by coating the sensor generally, and the electrode specifically as described herein, electrolysis can be prevented, and AC biasing to stimulate the electrodes can be used without impacting the signal transfer function of the sensor. However, the coating applied is not a conventional coating, as such conventional coatings applied uniformly to the sensor surface can lead to significant desensitizing of the sensor.

In one example, the present disclosure is drawn to an insulated sensor. The insulated sensor can include a silicon substrate including active circuitry on a surface thereof, an electrode disposed on the silicon substrate, a passivation layer having a thickness from greater than 500 Angstroms to 3,000 Angstroms disposed on the active circuitry, and an electrode insulating layer having a thickness from 10 Angstroms to 500 Angstroms disposed on the electrode.

In another example, the present disclosure is drawn to a method of creating an insulated sensor. In one example, the method can include, depositing a passivation layer over active circuitry and an electrode on a surface of a silicon substrate, and removing a portion or all of the passivation layer over the electrode to leave an opening over the electrode. The method can further include depositing an electrode insulating layer over the opening. The electrode insulating layer can be applied thinner than the passivation layer.

In a further example, a method of sensing analytes is presented. In one example, the method can include passing an analyte containing solution over an insulated sensor, applying a voltage to an electrode on surface of the sensor, and measuring the signal resulting that is related to the analyte. In one example, the insulated sensor can include a silicon substrate including active circuitry and an electrode on a surface thereof, a passivation layer having a thickness of greater than 500 Angstroms to 3000 Angstroms disposed on the active circuitry, and an electrode insulating layer having a thickness from 10 Angstroms to 500 Angstroms disposed on the electrode.

Turning now to the insulated sensor. In one example, as shown in FIG. 1, the insulated sensor 100 can include a silicon substrate 102 including active circuitry 103 on a surface thereof. An electrode 104 can be disposed on the silicon substrate, and a passivation layer 106 having a thickness from greater than 500 Angstroms to 3,000 Angstroms disposed on the active circuitry. Furthermore, an electrode insulating layer 108 having a thickness from 10 Angstroms to 500 Angstroms disposed on the electrode.

Turning to the silicon substrate and the active circuitry, in one example, it can include active circuitry of a complementary metal oxide semiconductor (CMOS) device, BiCMOS device (an integrated bipolar junction transistor and a CMOS transistor in a single device), laterally diffused metal oxide semiconductor (LDMOS) device, or a combination thereof. In one example, the silicon substrate can include active circuitry of a CMOS device. In some examples, the active circuitry of the substrate can include p-type, n-type, or a combination of p-type and n-type metal oxide semiconductor field effect transistors. In other examples, a portion of the bulk of the silicon substrate can be in direct contact with the analyte solution that is being measured via a microfluidic slot etched into the silicon substrate, or the silicon substrate may be designed to not contact the analyte solution that is being measured.

The silicon substrate can come in a variety of shapes, sizes, and thicknesses depending on the application for use of the insulated sensor. In one example, the silicon substrate can be rectangular. In another example, the silicon substrate can be square. In yet another example, the silicon substrate can be circular (round or oval) or semi-circular. In a further example, the substrate can be polygonal. The thickness of the substrate can also vary.

Turning now the electrode that can be applied on the silicon substrate. In one example, the electrode can include any conductive material metal or semi-conductive material. In one example, the electrode can be platinum, gold, silicon, polycrystalline silicon, or a combination thereof. In another example, the electrode can include gold. In yet another example, the gold electrode can be a helical gold. In another example, if a metal is selected, then the metal can be platinum, gold, copper, or any other metal that can be insulated. In still another example, the electrode can be polycrystalline silicon.

Figure 2:
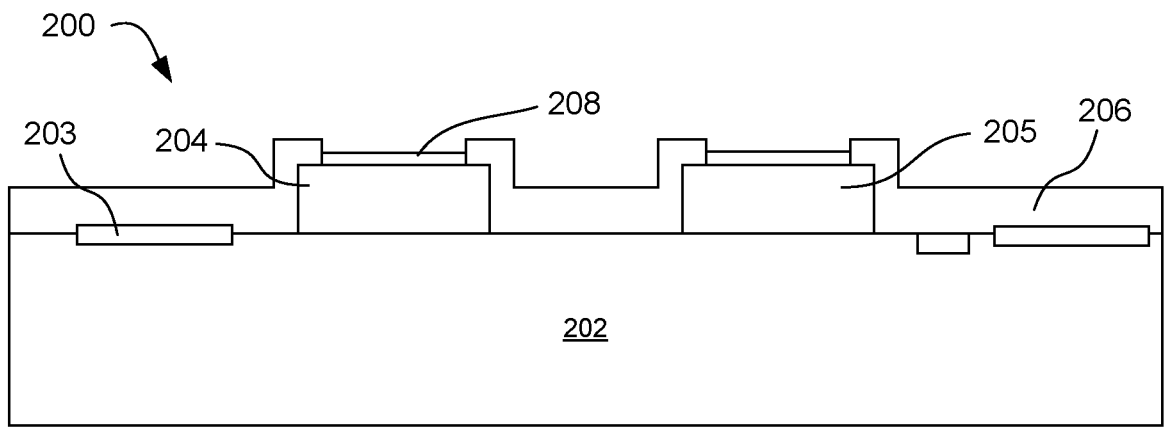
FIG. 2 schematically displays an example insulated sensor having two electrodes in accordance with the present disclosure.

Turning now to FIG. 2, the insulated sensor 200 can further include a second electrode 205, in addition to the first electrode 204, which can also be disposed on the silicon substrate 202. In one example, the second electrode also includes an electrode insulating layer 208 applied thereto (which may be similar to the electrode insulating layer disposed on the first electrode). Also shown in FIG. 2, the insulated sensor may include a passivation layer 206. In some examples, the insulated sensor can further include three or more electrodes (not shown).

The additional electrode(s) can be composed of any of the materials described with respect to the first electrode. In some examples, when multiple electrodes are present, the electrodes can be of different materials, or they can be of the same material.

The size of the electrode can vary depending on the design. In one example, the electrode can have a thickness ranging from about 2,000 A to about 4,000 A. In another example, the electrode can have a thickness ranging from about 2,500 A to about 3,000 A. In yet another example, the electrode can have a thickness ranging from about 1,500 A to about 2,500 A. In yet another embodiment, the electrode thickness can be determined by electrical properties and ease of processing. In some examples, the thickness of the electrode can relate to the sensitivity of the electrode. The lateral dimension of the electrodes can also have various dimensions, e.g., square, round, rectangular, oval, polygonal, etc. The size of the electrode measured in length along the greatest lateral axis can be from 5 µm to 30 µm, for example.

Turning now to the passivation layer and the electrode insulating layer, in one example, one or both of the passivation layer or the electrode insulating layer can include silicon carbide, silicon oxide, silicon nitride, silicon oxynitride, hafnium oxide, an oxide, a nitride, a carbide, or a combination thereof. For example, the passivation layer and/or the electrode insulating layer can include silicon carbide. In another example, the passivation layer and/or the electrode insulating layer silicon oxide. In a further example the passivation layer and/or the electrode insulating layer can be hafnium oxide. The passivation layer and the electrode insulating layer can be the same material, or they can be of different materials.

As mentioned, the passivation layer can be thicker than the electrode insulating layer. In one example, the passivation layer can have a thickness ranging from greater than 500 Angstroms (Å) to 3,000 A and the electrode insulating layer can have a thickness ranging from 10 A to 500 A. In another example, the passivation layer can have a thickness ranging from about 1,000 A to about 2,000 A and the electrode insulating layer can have a thickness ranging from about 100 A to about 500 A. In yet another example, the passivation layer can have a thickness ranging from about 1,250 A to about 1,750 A and the electrode insulating layer can have a thickness ranging from about 50 A to about 300 A. In accordance with this, a thin (10 A to 500 A) electrode insulating layer can provide enhanced sensitivity for the sensing electrode. For example, with some materials, the sensitivity of the electrode can be related to the thickness of the electrode insulating layer, e.g., inversely proportional. In many instances, the thinner the electrode insulating, the better, provided there is adequate thickness to protect the sensing electrode.

Figure 3:
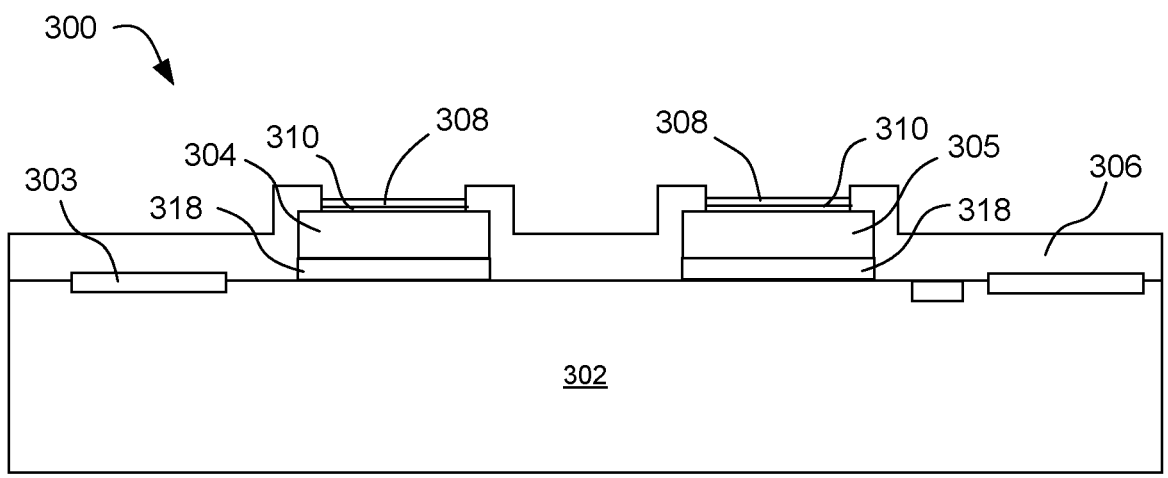
FIG. 3 schematically displays an example insulated sensor having two electrodes and further includes a titanium layer in accordance with the present disclosure.

In some examples, the insulated sensor can include additional layers. For example, as shown in FIG. 3, the insulating sensor 300 can further include an insulating adhesion layer 310 between the electrode 304 (or electrodes 304, 305) and the electrode insulating layer 308. Also shown in FIG. 3 are silicon substrate 302, the active circuitry 303, and the passivation layer 306, as previously described. In one example, the insulating adhesion layer can include titanium, tantalum, or a combination thereof. In some examples, the insulating adhesion layer can assist in bonding the electrode insulating layer to the electrode. In some examples, the insulating adhesion layer can occur along the sides of the electrodes and/or the upper surface of the electrode. In another example, portions of the electrode can be covered with the insulating adhesion layer. In one example, the insulating adhesion layer can have a thickness ranging from about 100 A to 1,000 A. In another example, the insulating adhesion layer can have a thickness ranging of about 500 A.

In further examples, the insulated sensor can further include a substrate adhesion layer 318, as shown in FIG. 3. In another example, the substrate adhesion layer can be present between the silicon substrate and the electrode and can be used to bind the electrode to the silicon substrate. In yet another example, the substrate adhesion layer can be any metal or semi-metal adhesion material. In some examples, the adhesion layer can be tantalum, titanium, or a combination thereof. In one example, the adhesion layer can be used in combination with any of the electrode materials described herein, such as a gold electrode, for example. When present, the adhesion layer can have a thickness ranging from about 1,000 A to about 3,000 A. In one example, the adhesion layer can have a thickness of about 1,500 A to about 2,500 A. In yet another example, the adhesion layer can further act as a cavitation layer.

The insulated sensors presented herein can, in one example, be an alternating current sensor and can enable the use of AC biasing. In some examples, a voltage of up to 1 V or more, and even up 12 V can be applied to the sensor, e.g., from 10 mV to 1 V, from 1 V to 2 V, from 10 mV to 12 V, from 50 mV to 12 V, from 0.1 V to 12 V, from 1 V to 12 V, or from 2 V to 12 V, etc. One advantage of the sensors described herein relates to the ability to use AC biasing above 1 V, which is not practical with uncoated sensors in contact with aqueous solutions.

In another example, an insulated sensor presented herein can be a transient current sensor. In transient current sensors, a pulse or step voltage can be applied to the insulated sensor, thereby causing a transient current to flow. In one example the insulated sensor can be a transient current sensor or an alternating current sensor.

In one example, these insulated sensors can be used in pumping, thermal, and/or electrical microfluidic applications. For example, an insulated sensor prepared in accordance with the present disclosure can be used in healthcare diagnostics, e.g., MEMS devices and/or microfluidics.

Figure 4:
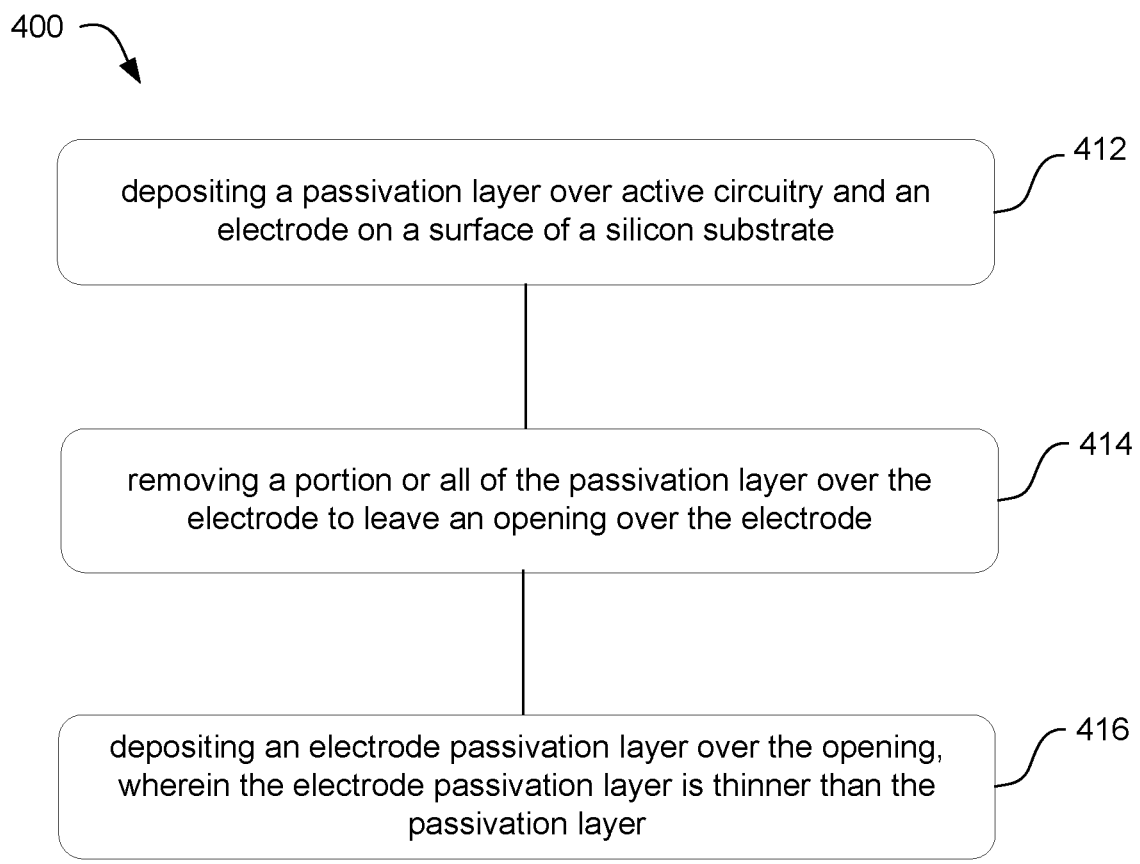
FIG. 4 is a flow diagram depicting an example method of creating an insulating sensor in accordance with the present disclosure.

In another example, a method for creating an insulated sensor is provided, and is shown generally in FIG. 4. The method 400 can include: depositing 412 a passivation layer over active circuitry and an electrode on a surface of a silicon substrate, removing 414 a portion or all of the passivation layer over the electrode to leave an opening over the electrode, and depositing 416 an electrode insulating layer over the opening, wherein the electrode insulating layer is thinner than the passivation layer 416.

Figure 5:
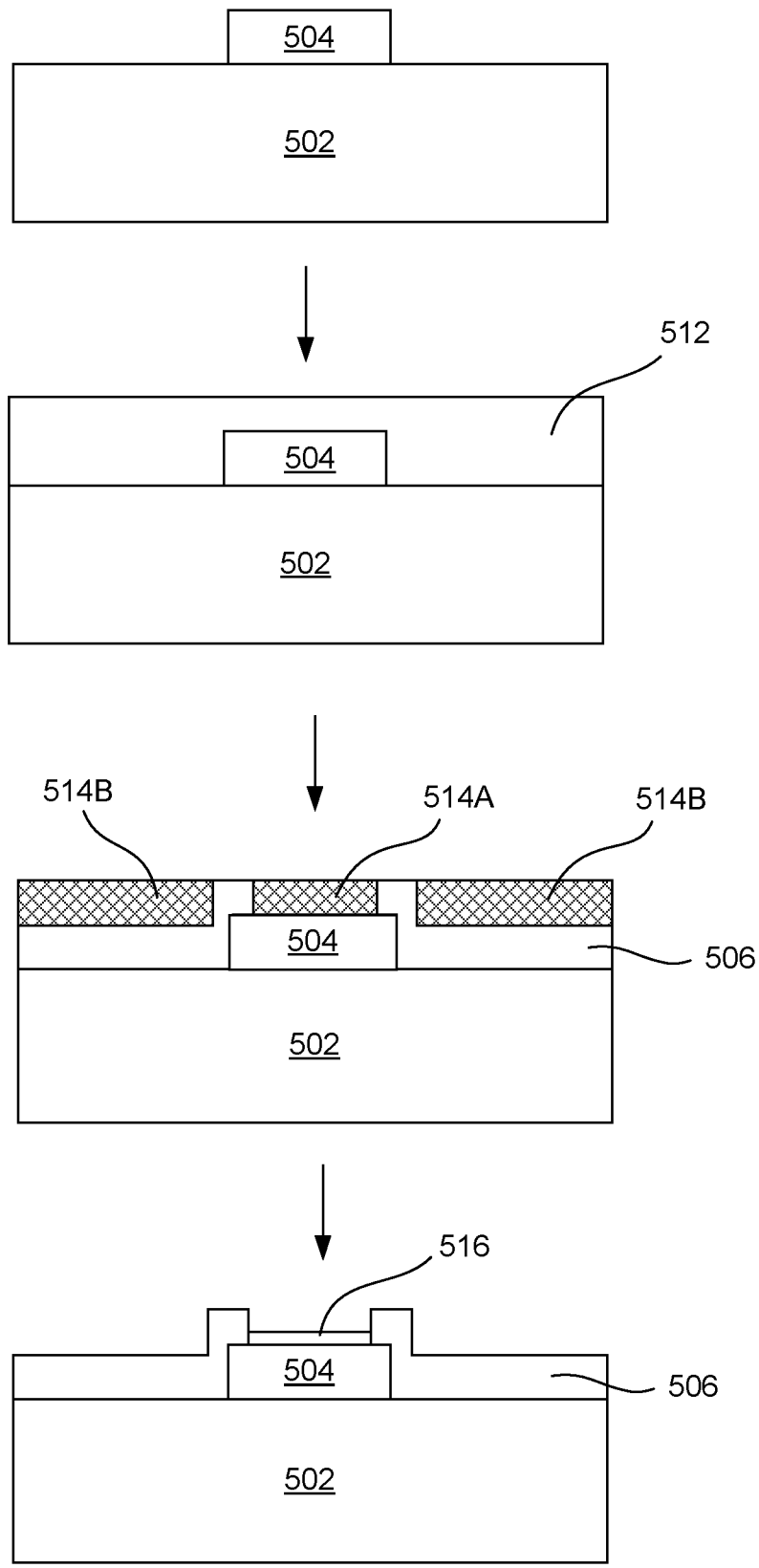
FIG. 5 schematically displays another example method of creating an insulated sensor in accordance with the present disclosure.

In further detail, this method can be schematically shown in context by example in FIG. 5. As depicted in FIG. 5, the method can include depositing a passivation layer 512 to a silicon substrate 502 including an electrode 504. An additional step can include removing a portion or all of the passivation layer over at least the electrode (represented at 514A in crosshatching), and in some examples over other portions of the substrate (represented at 5146 in crosshatching). Once removed, a step of depositing an electrode insulating layer 516 over the electrode can be carried out.

The depositing of the passivation layer and/or the electrode insulating layer can occur, in some examples, by physical vapor deposition (PVD), chemical vapor deposition (CVD), or atomic layer deposition (ALD). Sometimes, masking can be used if appropriate for a specific application. In one example, the depositing of the passivation layer, the electrode insulating layer, or both of these layers can be by ALD. In another example, the depositing of the passivation layer, the electrode insulating layer, or both of these layers is by PVD. In one example, the passivation layer can be deposited at a thickness of greater than 500 Angstroms to 3000 Angstroms and the electrode insulating layer can be deposited at a thickness from 10 Angstroms to 500 Angstroms, or within other ranges as previously described.

When removing a portion or all of the passivation layer from over the electrode, this can be carried out by applying a patterned resist material over the passivation layer to mask the pattern of the openings over the electrodes, and then removing a portion or all of the passivation layer over the electrodes. The step of removing a portion or all can include etching away a portion or all of the passivation layer that remains unmasked. In some examples, the etching can include wet etching, dry etching, chemical-mechanical planarization (CMP), reactive-ion etching (RIE), deep reactive-ion etching (DRIE). In one example, the etching can be isotropic or anisotropic.

Regardless of how it is formed, the opening that is patterned and/or created over the electrodes can be maximized over the electrode. In other examples, the opening that is created can leave a lip of passivation layer over a peripheral upper edge of the electrodes (on the top surface), as shown in FIGS. 1-3. In one example, the opening over the electrode can have a length of greater than 0.5 μm (along it greatest lateral axis). In another example, the opening over the electrode can have a length of greater than 1 μm.

In some examples, the method can further include depositing a substrate adhesion layer and/or an insulating adhesion layer, as described in connection with FIG. 3. For example, the method can include patterning and/or removing an opening over the electrode on the silicon substrate, and when the opening is formed, an insulating adhesion layer can be applied over electrode. Likewise, a substrate adhesion layer can be applied to the silicon substrate to adhere any structure to the surface thereof.

In additional examples, the method can further include applying ash and/or a strip resist. The ash and/or strip resist can be applied after removing a portion or all of the passivation layer over the electrodes and applied over the electrodes before depositing the electrode insulating layer. In one example, the ash and/or strip resist can be applied over the substrate adhesion layer and/or the insulating adhesion layer, if present.

The deposition, etch, ash, and/or strip resist times can vary depending on the desired thickness of the layer.

Figure 6:
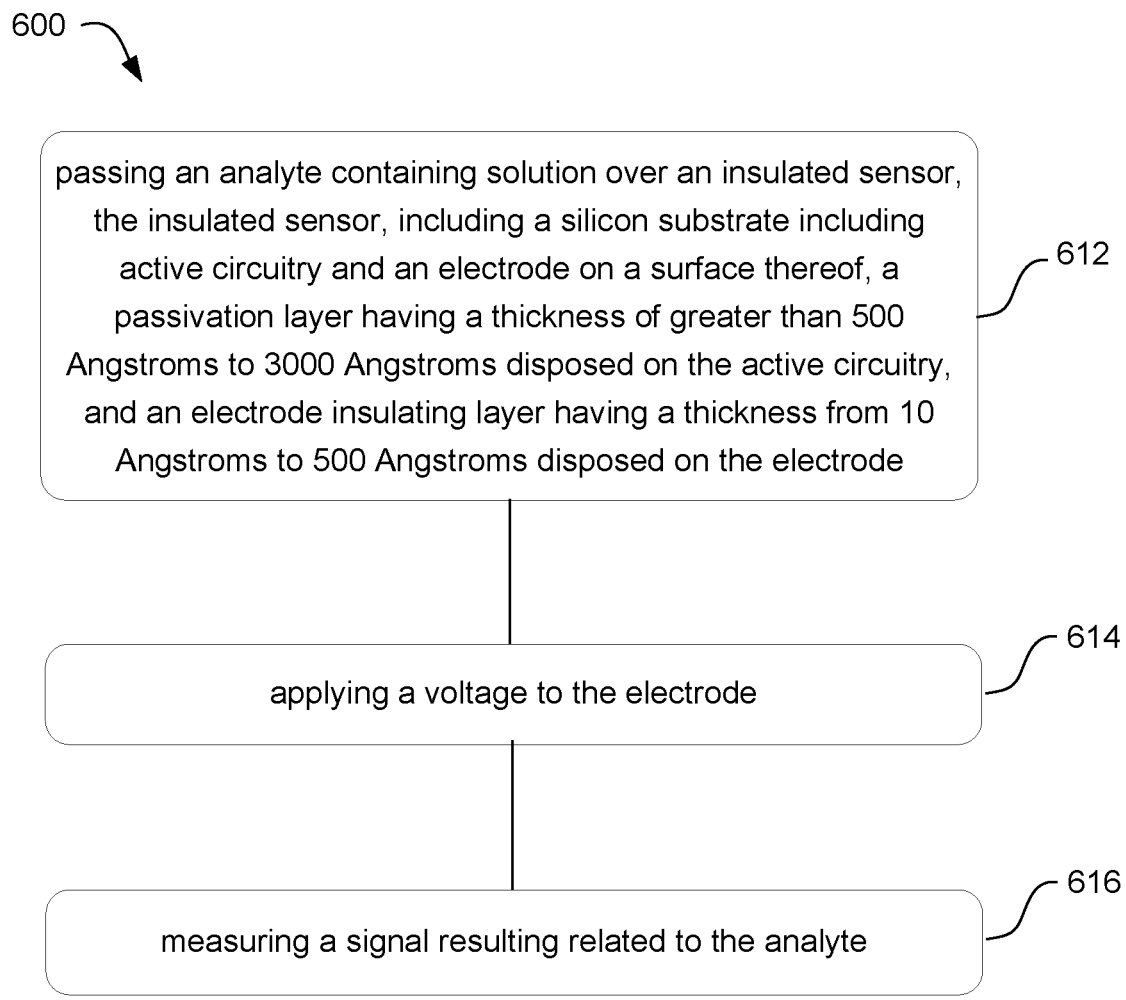
FIG. 6 is a flow diagram depicting an example method of sensing analytes in accordance with the present disclosure.

In another example, a method for sensing analytes is disclosed. The method 600, which is shown in FIG. 6 can include passing 612 an analyte containing solution over an insulated sensor, applying 614 a voltage to the electrode, and 616 measuring a signal resulting related to the analyte. In one example, the insulated sensor can include a silicon substrate having active circuitry and an electrode on a surface thereof, a passivation layer having a thickness of greater than 500 Angstroms to 3,000 Angstroms disposed on the active circuitry, and an electrode insulating layer having a thickness from 10 Angstroms to 500 Angstroms disposed on the electrode. In another example, the insulated sensor can be as described above.

In one example of this method, a potential of at least 1 volt can be applied to the electrode in the presence of the solution, and electrons from the electrode are not transferred to the solution. In another example, the voltage that is applied to the electrode can be up to a maximum of 12 V, e.g., from 10 mV to 1 V, from 1 V to 2 V, from 10 mV to 12 V, from 50 mV to 12 V, from 0.1 V to 12 V, from 1 V to 12 V, or from 2 V to 12 V, without electrons from the electrode being transferred into the testing solution that contains the analytes.

The analyte that is measured using the insulated sensor described above is not particularly limited. In one example, the insulated sensor can be utilized to measure analytes in a healthcare diagnostic setting, environmental quality monitoring, industrial process monitoring, or public safety monitoring.

It is noted that, as used in this specification and the appended claims, the singular forms "a," "an," and "the" include plural referents unless the context clearly dictates otherwise.

As used herein, the term "about" is used to provide flexibility to a numerical range endpoint by providing that a given value may be "a little above" or "a little below" the endpoint. The degree of flexibility of this term can be dictated by the particular variable and determined based on the associated description herein.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include individual numerical values or sub-ranges encompassed within that range as if each numerical value and sub-range is explicitly recited. As an illustration, a numerical range of "about 1 wt % to about 5 wt %" should be interpreted to include not only the explicitly recited values of about 1 wt % to about 5 wt %, but also include individual values and sub-ranges within the indicated range. Thus, included in this numerical range are individual values such as 2, 3.5, and 4 and sub-ranges such as from 1-3, from 2-4, and from 3-5, etc. This same principle applies to ranges reciting only one numerical value. Furthermore, such an interpretation should apply regardless of the breadth of the range or the characteristics being described

EXAMPLES

The following illustrates examples of the present disclosure. However, it is to be understood that the following is only illustrative of the application of the principles of the present disclosure. Numerous modifications and alternative compositions, methods, and systems may be devised without departing from the spirit and scope of the present disclosure. The appended claims are intended to cover such modifications and arrangements.

Example 1—Insulated Sensor Having a Polycrystalline Silicon Electrode

A CMOS sensor having active circuitry and an electrode on a surface thereof is insulated in accordance with the methods described herein. First, a passivation layer of silicon carbide layer is deposited by plasma enhanced CVD deposition over the entire CMOS sensor, including surface active circuitry and a polycrystalline silicon electrode. The passivation layer 1,500 A thick. Next, an opening is wet etched over a polycrystalline silicon electrode. An electrode insulating layer of silicon carbide is deposited by plasma enhanced CVD deposition over the electrode at a thickness of 50 A.

Example 2—Insulated Sensor Having Gold Electrode

A titanium adhesive layer is applied to a CMOS sensor having active circuitry on a surface thereof at a thickness of 2,000 A. A helical gold electrode is placed onto the titanium adhesive layer, which is bonded to the silicon substrate. A passivation layer of silicon carbide is deposited by ALD deposition over the entire CMOS sensor, including over the gold electrode and the active circuitry. The passivation layer 3,000 A thick. Next, an opening is wet etched over a portion of the silicon carbide that is covering the gold electrode. An electrode insulating layer of silicon carbide is deposited by plasma enhanced CVD deposition over the electrode at a thickness of 450 A.

What is claimed is:

1. An insulated sensor, comprising:
   a silicon substrate including active circuitry on a surface thereof;
   an electrode disposed on the silicon substrate;
   a passivation layer having a thickness from greater than 500 Angstroms to 3,000 Angstroms disposed on the active circuitry; and
   an electrode insulating layer having a thickness from 10 Angstroms to 500 Angstroms disposed on the electrode, wherein the electrode insulating layer is on the electrode within an opening in the passivation layer having a length of greater than 0.5 µm.

2. The insulated sensor of claim 1, wherein the silicon substrate includes a CMOS device, a BiCMOS device, a LDMOS device, or a combination thereof.

3. The insulated sensor of claim 1, wherein the electrode comprises platinum, gold, polycrystalline silicon, or a combination thereof.

4. The insulated sensor of claim 1, wherein the electrode comprises helical gold.

5. The insulated sensor of claim 1, further comprising a second electrode also disposed on the silicon substrate, wherein the second electrode also includes an electrode insulating layer applied thereto.

6. The insulated sensor of claim 1, wherein one or both of the passivation layer or the electrode insulating layer includes silicon carbide, silicon oxide, silicon nitride, silicon oxy-nitride, hafnium oxide, an oxide, a nitride, a carbide, or a combination thereof.

7. The insulated sensor of claim 1, further comprising a titanium layer between the electrode and the electrode insulating layer.

8. The insulated sensor of claim 1, wherein the insulated sensor is a transient or alternating current sensor.

9. A method of creating an insulated sensor, comprising:
   depositing a passivation layer over active circuitry and an electrode on a surface of a silicon substrate;
   removing a portion or all of the passivation layer over the electrode to leave an opening over the electrode, wherein the opening over the electrode has a length greater than 0.5 µm; and
   depositing an electrode insulating layer over the opening, wherein the electrode insulating layer is thinner than the passivation layer.

10. The method of claim 9, wherein the step of removing the portion includes etching away the portion of the passivation layer.

11. The method of claim 9, wherein the passivation layer has a thickness of greater than 500 Angstroms to 3000 Angstroms and the electrode insulating layer has a thickness from 10 Angstroms to 500 Angstroms.

12. The method of claim 9, further comprising depositing a titanium layer over the electrode prior to depositing the passivation layer or the electrode insulating layer.

13. A method of sensing analytes, comprising:
   passing an analyte containing solution over an insulated sensor, the insulated sensor, comprising:
      a silicon substrate including active circuitry and an electrode on a surface thereof,
      a passivation layer having a thickness of greater than 500 Angstroms to 3000 Angstroms disposed on the active circuitry, and
      an electrode insulating layer having a thickness from 10 Angstroms to 500 Angstroms disposed on the electrode;
   applying a voltage to the electrode; and
   measuring a signal resulting related to the analyte,
   wherein upon applying a potential of at least 1 V to the electrode in the presence of the solution, electrons from the electrode are not transferred to the solution.

14. The method of claim 9, wherein the active circuitry and the electrode on the surface of the silicon substrate includes a CMOS device, a BiCMOS device, a LDMOS device, or a combination thereof.

15. The method of claim 9, wherein the electrode comprises platinum, gold, polycrystalline silicon, or a combination thereof.

16. The method of claim 9, wherein the electrode comprises helical gold.

17. The method of claim 9, wherein one or both of the passivation layer or the electrode insulating layer includes silicon carbide, silicon oxide, silicon nitride, silicon oxynitride, hafnium oxide, an oxide, a nitride, a carbide, or a combination thereof.

18. The method of claim 9, further comprising applying a titanium layer between the electrode and the passivation layer.

19. The method of claim 9, wherein the insulated sensor is a transient or alternating current sensor.

20. The method of claim 13, wherein the electrode insulating layer is on the electrode at an opening in the passivation layer having a length of greater than 0.5 μm.

* * * * *